United States Patent
Matsumoto et al.

(10) Patent No.: US 8,349,207 B2
(45) Date of Patent: Jan. 8, 2013

(54) AQUEOUS DISPERSION FOR CHEMICAL MECHANICAL POLISHING AND CHEMICAL MECHANICAL POLISHING METHOD FOR SEMICONDUCTOR DEVICE

(75) Inventors: Taichi Matsumoto, Tsuchiura (JP); Tomikazu Ueno, Yokkaichi (JP); Michiaki Andou, Yokkaichi (JP)

(73) Assignee: JSR Corporation, Tokyo (JP)

( * ) Notice: Subject to any disclaimer, the term of this patent is extended or adjusted under 35 U.S.C. 154(b) by 457 days.

(21) Appl. No.: 12/529,545

(22) PCT Filed: Feb. 20, 2008

(86) PCT No.: PCT/JP2008/052803
§ 371 (c)(1),
(2), (4) Date: Nov. 23, 2009

(87) PCT Pub. No.: WO2008/117592
PCT Pub. Date: Oct. 2, 2008

(65) Prior Publication Data
US 2010/0099260 A1 Apr. 22, 2010

(30) Foreign Application Priority Data
Mar. 26, 2007 (JP) ................. 2007-078748

(51) Int. Cl.
*C09K 13/06* (2006.01)
(52) U.S. Cl. .......... 252/79.4; 252/79.1; 438/693; 216/89
(58) Field of Classification Search .............. 252/79.1, 252/79.2, 79.3, 79.4; 438/692, 693, 757; 216/108, 90, 91
See application file for complete search history.

(56) References Cited

U.S. PATENT DOCUMENTS

| | | | |
|---|---|---|---|
| 6,239,032 B1 | 5/2001 | Nakamura et al. | |
| 7,560,384 B2 | 7/2009 | Shida et al. | |
| 2003/0166338 A1 | 9/2003 | Ahn et al. | |

(Continued)

FOREIGN PATENT DOCUMENTS

EP 1 650 278 A2 4/2006

(Continued)

OTHER PUBLICATIONS

U.S. Appl. No. 12/866,571, filed Aug. 6, 2010, Shida, et al.

(Continued)

*Primary Examiner* — Lan Vinh
(74) *Attorney, Agent, or Firm* — Oblon, Spivak, McClelland, Maier & Neustadt, L.L.P.

(57) ABSTRACT

A chemical mechanical polishing aqueous dispersion includes (A) colloidal silica having an average particle size calculated from the specific surface area determined by the BET method of 10 to 60 nm, (B) an organic acid having two or more carboxyl groups and one or more hydroxyl groups in one molecule, and (C) a quaternary ammonium compound shown by the following general formula (1),

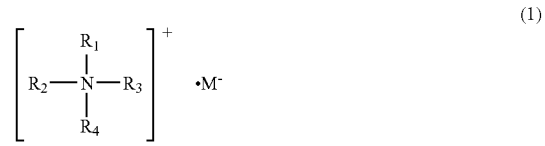

wherein $R_1$ to $R_4$ individually represent hydrocarbon groups, and $M^-$ represents an anion, the chemical mechanical polishing aqueous dispersion having a pH of 3 to 5.

12 Claims, 5 Drawing Sheets

U.S. PATENT DOCUMENTS

| | | | |
|---|---|---|---|
| 2004/0203252 A1 | 10/2004 | Park | |
| 2005/0208883 A1* | 9/2005 | Yoshida et al. | 451/41 |
| 2006/0075688 A1* | 4/2006 | Takenouchi | 51/307 |
| 2006/0108326 A1* | 5/2006 | Dysard et al. | 216/88 |
| 2006/0201914 A1 | 9/2006 | Uchikura et al. | |
| 2006/0276041 A1 | 12/2006 | Uchikura et al. | |
| 2007/0251155 A1* | 11/2007 | Dysard et al. | 51/298 |
| 2008/0318427 A1 | 12/2008 | Kunitani et al. | |
| 2009/0124172 A1 | 5/2009 | Uchikura et al. | |
| 2009/0165395 A1 | 7/2009 | Ikeda et al. | |
| 2011/0250756 A1 | 10/2011 | Uchikura et al. | |

FOREIGN PATENT DOCUMENTS

| | | |
|---|---|---|
| JP | 6 124932 | 5/1994 |
| JP | 11 176773 | 7/1999 |
| JP | 2002 313758 | 10/2002 |
| JP | 2004 214667 | 7/2004 |
| JP | 2004 269577 | 9/2004 |
| JP | 2006-120728 A | 5/2006 |
| WO | WO 2008/117593 A1 | 10/2008 |

OTHER PUBLICATIONS

U.S. Appl. No. 12/918,013, filed Aug. 17, 2010, Shida, et al.
U.S. Appl. No. 12/867,954, filed Aug. 17, 2010, Motonari, et al.
U.S. Appl. No. 12/919,897, filed Aug. 27, 2010, Nishimoto, et al.
Extended European Search Report issued May 20, 2011, in Patent Application No. 08711609.1.
U.S. Appl. No. 12/295,872, filed Oct. 3, 2008, Takemura, et al.
U.S. Appl. No. 12/297,949, filed Oct. 21, 2008, Namie, et al.
U.S. Appl. No. 12/374,074, filed Jan. 16, 2009, Andou, et al.
U.S. Appl. No. 12/467,729, filed May 18, 2009, Kunitani, et al.
U.S. Appl. No. 12/537,766, filed Aug. 7, 2009, Abe, et al.
U.S. Appl. No. 12/676,272, filed Mar. 3, 2010, Takemura, et al.
U.S. Appl. No. 12/749,934, filed Mar. 30, 2010, Shida, et al.

* cited by examiner

AQUEOUS DISPERSION FOR CHEMICAL MECHANICAL POLISHING AND CHEMICAL MECHANICAL POLISHING METHOD FOR SEMICONDUCTOR DEVICE

TECHNICAL FIELD

The present invention relates to a chemical mechanical polishing aqueous dispersion and a chemical mechanical polishing method for a semiconductor device using the chemical mechanical polishing aqueous dispersion.

BACKGROUND ART

Various chemical mechanical polishing (hereinafter referred to as "CMP") aqueous dispersions that can chemically and mechanically polish a silicon oxide film, a polysilicon film, or the like at a practical polishing rate have been developed. On the other hand, most of the chemical mechanical polishing aqueous dispersions cannot polish a silicon nitride film at a practical polishing rate. Therefore, a method that removes a silicon oxide film formed on a silicon nitride film by CMP using the silicon nitride film as a stopper has been used. The silicon nitride film used as the stopper must be removed after removing the silicon oxide film.

However, when using a method that dissolves a silicon nitride film by using hot phosphoric acid and removes the silicon nitride film by etching, the silicon nitride film may remain or the lower layer of the silicon nitride film may be damaged since the etching treatment is controlled based on the etching time. Therefore, it is desirable to remove the silicon nitride film by CMP.

If the silicon nitride film can be removed by CMP using the silicon oxide film as a stopper, CMP can be applied to shallow trench isolation, self-aligned contact formation, and the like. Therefore, a high-performance device having high reliability can be produced.

In order to selectively remove the silicon nitride film by CMP, the polishing rate ratio of the silicon nitride film to the silicon oxide film (hereinafter simply referred to as "polishing rate ratio") must be sufficiently increased.

JP-A-6-124932, JP-A-11-176773, and JP-A-2004-214667 disclose chemical mechanical polishing aqueous dispersions having an increased polishing rate ratio. However, these chemical mechanical polishing aqueous dispersions cannot achieve a polishing rate ratio sufficient for practical applications.

DISCLOSURE OF THE INVENTION

An object of the invention is to provide a chemical mechanical polishing aqueous dispersion which can polish a silicon nitride film at a sufficiently high polishing rate and for which the polishing rate of a silicon oxide film can be controlled, and a chemical mechanical polishing method for a semiconductor device using the chemical mechanical polishing aqueous dispersion.

According to the invention, there is provided a chemical mechanical polishing aqueous dispersion comprising (A) colloidal silica having an average particle size calculated from the specific surface area determined by the BET method of 10 to 60 nm, (B) an organic acid having two or more carboxyl groups and one or more hydroxyl groups in one molecule, and (C) a quaternary ammonium compound shown by the following general formula (1),

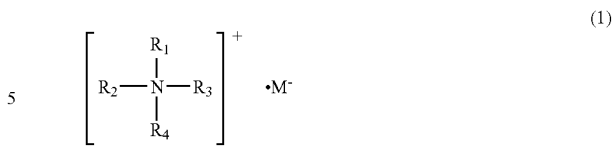

wherein $R_1$ to $R_4$ individually represent hydrocarbon groups, and $M^-$ represents an anion, the chemical mechanical polishing aqueous dispersion having a pH of 3 to 5.

In the chemical mechanical polishing aqueous dispersion according to the invention, the component (B) may be at least one organic acid selected from tartaric acid, malic acid, and citric acid.

The chemical mechanical polishing aqueous dispersion according to the invention may further comprise phosphoric acid or a derivative thereof.

The chemical mechanical polishing aqueous dispersion according to one aspect of the invention may have the following features when the chemical mechanical polishing aqueous dispersion is used to selectively polish a silicon nitride film.

The mass ratio ((B)/(A)) of the component (B) to the component (A) may be 0.02 to 10.

The ratio (Rmax/Rmin) of the major axis (Rmax) to the minor axis (Rmin) of colloidal silica particles used as the component (A) may be greater than 1.3.

The chemical mechanical polishing aqueous dispersion may have a polishing rate ratio (silicon nitride film/silicon oxide film) of a silicon nitride film to a silicon oxide film of greater than 10.

According to the invention, there is provided a chemical mechanical polishing method for a semiconductor device, the method comprising selectively polishing a silicon nitride film formed on a silicon oxide film by using the above chemical mechanical polishing aqueous dispersion, and stopping polishing when the surface of the silicon oxide film is exposed.

The chemical mechanical polishing aqueous dispersion according to one aspect of the invention may have the following features when the chemical mechanical polishing aqueous dispersion is used to simultaneously polish a silicon oxide film and a silicon nitride film.

The ratio (Rmax/Rmin) of the major axis (Rmax) to the minor axis (Rmin) of colloidal silica particles used as the component (A) may be 1.0 to 1.3.

The chemical mechanical polishing aqueous dispersion may have a polishing rate ratio (silicon nitride film/silicon oxide film) of a silicon nitride film to a silicon oxide film of 0.7 to 1.4.

According to the invention, there is provided a chemical mechanical polishing method for a semiconductor device that includes a silicon oxide film and a silicon nitride film on the surface of the semiconductor device, the method comprising simultaneously polishing the silicon oxide film and the silicon nitride film by using the above chemical mechanical polishing aqueous dispersion.

Since the chemical mechanical polishing aqueous dispersion according to one aspect of the invention has a sufficiently high polishing rate ratio of a silicon nitride film to a silicon oxide film, a silicon nitride film can be selectively polished. The chemical mechanical polishing aqueous dispersion according to one aspect of the invention is particularly effective when it is necessary to polish and remove a silicon nitride film of a semiconductor device in which a silicon oxide film is used as a stopper and dishing of a silicon oxide film with respect to the silicon nitride film has occurred due to CMP.

Since the chemical mechanical polishing aqueous dispersion according to one aspect of the invention can sufficiently increase the polishing rate of a silicon oxide film and the polishing rate of a silicon nitride film to an almost equal level, a silicon oxide film and a silicon nitride film can be simultaneously polished.

BEST MODE FOR CARRYING OUT THE INVENTION

Figure 1:
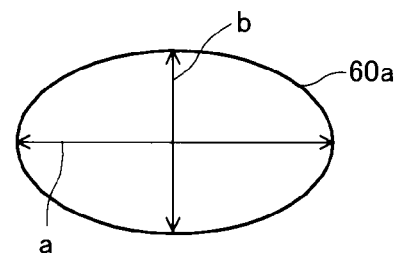
FIG. 1 is a conceptual diagram schematically illustrating the major axis and the minor axis of a colloidal silica particle.

Preferred embodiments of the invention are described below. Note that the invention is not limited to the following embodiments. Various modifications may be made without departing from the scope of the invention.

1. CHEMICAL MECHANICAL POLISHING AQUEOUS DISPERSION

A chemical mechanical polishing aqueous dispersion according to one embodiment of the invention includes (A) colloidal silica having an average particle size calculated from the specific surface area determined by the BET method of 10 to 60 nm, (B) an organic acid having two or more carboxyl groups and one or more hydroxyl groups in one molecule, and (C) a quaternary ammonium compound shown by the following general formula (1),

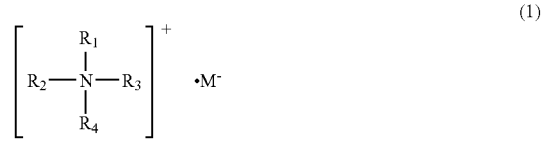

wherein $R_1$ to $R_4$ individually represent hydrocarbon groups, and $M^-$ represents an anion, the chemical mechanical polishing aqueous dispersion having a pH of 3 to 5.

Each component of the chemical mechanical polishing aqueous dispersion according to this embodiment is described in detail below.

1.1 Colloidal Silica (A)

The chemical mechanical polishing aqueous dispersion according to this embodiment includes colloidal silica as abrasive grains. The average particle size of the colloidal silica calculated from the specific surface area determined by the BET method is preferably 10 to 60 nm, more preferably 12 to 55 nm, and particularly preferably 15 to 40 nm. If the average particle size of the colloidal silica is 10 to 60 nm, the chemical mechanical polishing aqueous dispersion exhibits excellent storage stability. Therefore, the performance (e.g., polishing rate) of the chemical mechanical polishing aqueous dispersion immediately after production can be maintained. If the average particle size of the colloidal silica is less than 10 nm, the polishing rate of a silicon nitride film decreases to a large extent. If the average particle size of the colloidal silica is more than 60 nm, a silicon oxide film is mechanically polished by the colloidal silica (i.e., the polishing rate of the silicon oxide film increases to a large extent).

The average particle size of the colloidal silica is calculated from the specific surface area determined by the BET method using a measuring instrument "Micrometrics FlowSorb II 2300" (manufactured by Shimadzu Corporation), for example.

A method of calculating the average particle size of the colloidal silica from the specific surface area is described below.

The diameter of the colloidal silica particle is referred to as d (nm), and the specific gravity of the colloidal silica particle is referred to as $\rho(g/cm^3)$ on the assumption that the shape of the colloidal silica particle is spherical. The surface area A of n particles is $n\pi d^2$. The mass N of n particles is $\rho n\pi d^3/6$. The specific surface area S is indicated by the surface area of all particles contained in a powder per unit mass. Therefore, the specific surface area S of n particles is $A/N=6/\rho d$. Substituting the specific gravity $\rho(=2.2)$ of the colloidal silica in this expression and converting the unit yields the following expression (2).

$$\text{Average particle size (nm)} = 2727/S(m^2/g) \quad (2)$$

The average particle size of the colloidal silica mentioned herein is calculated based on the expression (2).

The colloidal silica is preferably added in an amount of 1 to 5 mass %, more preferably 1.25 to 4 mass %, and particularly preferably 1.5 to 3 mass %, based on the mass of the chemical mechanical polishing aqueous dispersion during use. If the amount of the colloidal silica is less than 1 mass %, a sufficient polishing rate cannot be achieved. If the amount of the colloidal silica is more than 5 mass %, the cost of the chemical mechanical polishing aqueous dispersion increases. Moreover, a stable chemical mechanical polishing aqueous dispersion may not be obtained.

The polishing rate ratio of a silicon nitride film to a silicon oxide film may be controlled by appropriately selecting the shape of the colloidal silica particles. If the ratio (Rmax/Rmin) of the major axis (Rmax) to the minor axis (Rmin) of the colloidal silica particles is greater than 1.3, preferably 1.4 to 3, and more preferably 1.5 to 2.5, the polishing rate ratio of a silicon nitride film to a silicon oxide film can be sufficiently increased. Therefore, a silicon nitride film can be selectively polished and planarized in a CMP step that preferentially polishes the silicon nitride film while suppressing dishing or erosion of the silicon nitride film. If the ratio (Rmax/Rmin) of the major axis (Rmax) to the minor axis (Rmin) of the colloidal silica particles is 1.0 to 1.3, preferably 1.1 to 1.3, and more preferably 1.1 to 1.2, the polishing rate of a silicon oxide film can be made almost equal to that of a silicon nitride film, and the polishing rate ratio can be maintained during polishing. Therefore, a silicon oxide film and a silicon nitride film can be simultaneously polished in a CMP step that simultaneously polishes the silicon oxide film and the silicon nitride film while suppressing dishing or erosion of the silicon oxide film.

The major axis (Rmax) of the colloidal silica particle refers to the longest distance between two peripheral points of an image of the colloidal silica particle photographed using a transmission electron microscope. The minor axis (Rmin) of the colloidal silica particle refers to the shortest distance between two peripheral points of an image of the colloidal silica particle photographed using a transmission electron microscope.

Figure 2:
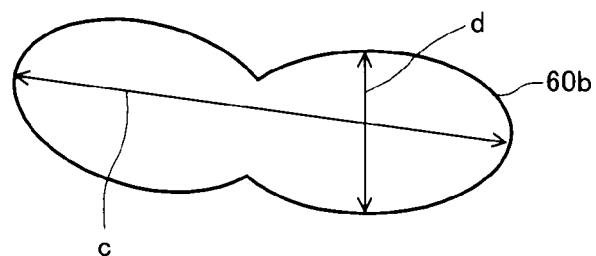
FIG. 2 is a conceptual diagram schematically illustrating the major axis and the minor axis of a colloidal silica particle.
Figure 3:
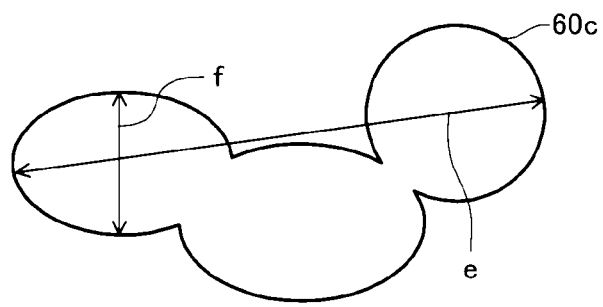
FIG. 3 is a conceptual diagram schematically illustrating the major axis and the minor axis of a colloidal silica particle.

As illustrated in FIG. 1, when an image of a colloidal silica particle 60a photographed using a transmission electron microscope is elliptical, the major axis a of the elliptical shape is determined to be the major axis (Rmax) of the colloidal silica particle, and the minor axis b of the elliptical shape is determined to be the minor axis (Rmin) of the colloidal silica particle. As illustrated in FIG. 2, when an image of a colloidal silica particle 60b photographed using a transmission electron microscope is an aggregate of two particles, the longest distance c between two peripheral points of the image is determined to be the major axis (Rmax) of the colloidal silica particle, and the shortest distance d between two peripheral points of the image is determined to be the minor axis (Rmin) of the colloidal silica particle. As illustrated in FIG. 3, when an image of a colloidal silica particle 60c photographed using a transmission electron microscope is an aggregate of three particles, the longest distance e between two peripheral points of the image is determined to be the major axis (Rmax) of the colloidal silica particle, and the shortest distance f between two peripheral points of the image is determined to be the minor axis (Rmin) of the colloidal silica particle.

For example, the major axis (Rmax) and the minor axis (Rmin) of each of fifty colloidal silica particles are measured using the above-described method. The average value of the major axes (Rmax) and the average value of the minor axes (Rmin) are calculated, and the ratio (Rmax/Rmin) of the major axis to the minor axis is then calculated.

1.2. Organic Acid (B)

The chemical mechanical polishing aqueous dispersion according to this embodiment includes an organic acid having two or more carboxyl groups and one or more hydroxyl groups in one molecule. The hydroxyl group included in the organic acid is bonded to a nitrogen atom included in a silicon nitride film via a hydrogen bond so that a large amount of organic acid can be bonded to the surface of the silicon nitride film. The carboxyl group included in the organic acid thus exerts a chemical polishing effect on the silicon nitride film so that the polishing rate of the silicon nitride film can be increased. If the organic acid has a hydrophobic functional group (e.g., methyl group or vinyl group) in the molecule, the polishing rate of the silicon nitride film decreases. Examples of the organic acid having two or more carboxyl groups and one or more hydroxyl groups in one molecule include tartaric acid, malic acid, citric acid, and the like. Among these, tartaric acid that does not include a methylene group in the molecule is particularly preferable. These organic acids may be used either individually or in combination.

The organic acid is preferably added in an amount of 0.1 to 5 mass %, more preferably 0.2 to 4 mass %, and particularly preferably 0.5 to 3 mass %, based on the mass of the chemical mechanical polishing aqueous dispersion during use. If the amount of the organic acid is less than 0.1 mass %, the polishing rate decreases to a large extent. If the organic acid is added in amount of more than 5 mass %, the polishing rate of a silicon nitride film increases to only a small extent while the polishing rate of a silicon oxide film increases.

The mass ratio ((B)/(A)) of the organic acid (B) to the colloidal silica (A) in the chemical mechanical polishing aqueous dispersion according to this embodiment is preferably 0.02 to 10, more preferably 0.05 to 8, and particularly preferably 0.1 to 5. If the mass ratio ((A)/(B)) is within the above range, the polishing rate of a silicon nitride film can be increased while decreasing the polishing rate of a silicon oxide film. This makes it possible to selectively polish a silicon nitride film while suppressing dishing of a silicon oxide film. If the mass ratio ((A)/(B)) is less than 0.02, the polishing rate of a silicon nitride film may not be sufficiently increased. If the mass ratio ((A)/(B)) is more than 10, it may be difficult to selectively polish a silicon nitride film since the balance between the amount of the colloidal silica and the amount of the organic acid is lost.

1.3 Quaternary Ammonium Compound (C)

The chemical mechanical polishing aqueous dispersion according to this embodiment includes a quaternary ammonium compound shown by the following general formula (1).

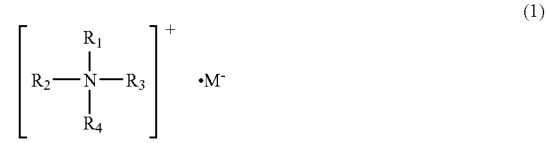

(1)

wherein $R_1$ to $R_4$ individually represent hydrocarbon groups, and $M^-$ represents an anion.

The quaternary ammonium compound is used to adjust the pH of the chemical mechanical polishing aqueous dispersion and decrease the polishing rate of a silicon oxide film.

Examples of the hydrocarbon groups represented by $R_1$ to $R_4$ in the general formula (I) may be an aliphatic hydrocarbon group, an aromatic hydrocarbon group, an aromatic-aliphatic hydrocarbon group, or an alicyclic hydrocarbon group. The aliphatic hydrocarbon group (e.g., aliphatic hydrocarbon group or aromatic-aliphatic hydrocarbon group) may be saturated or unsaturated, and may be linear or branched. Specific examples of the hydrocarbon groups include a linear, branched, or cyclic saturated or unsaturated alkyl group, an aralkyl group, an aryl group, and the like.

As the alkyl group, a lower alkyl group having 1 to 6 carbon atoms is preferable, with a lower alkyl group having 1 to 4 carbon atoms being particularly preferable. Specific examples of the alkyl group include a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, a neopentyl group, an n-hexyl group, an isohexyl group, a sec-hexyl group, a tert-hexyl group, a cyclopentyl group, a cyclohexyl group, a vinyl group, an n-propenyl group, an isopropenyl group, an n-butenyl group, an isobutenyl group, a sec-butenyl group, a tert-butenyl group, and the like.

As the aralkyl group, an aralkyl group having 7 to 12 carbon atoms is preferable. Specific examples of the aralkyl group include a benzyl group, a phenethyl group, a phenylpropyl group, a phenylbutyl group, a phenylhexyl group, a methylbenzyl group, a methylphenethyl group, an ethylbenzyl group, and the like.

As the aryl group, an aryl group having 6 to 14 carbon atoms is preferable. Specific examples of the aryl group include a phenyl group, an o-tolyl group, an m-tolyl group, a p-tolyl group, a 2,3-xylyl group, a 2,4-xylyl group, a 2,5-xylyl group, a 2,6-xylyl group, a 3,5-xylyl group, a naphthyl group, an anthryl group, and the like.

The aromatic ring of the aryl group or the aralkyl group may have a lower alkyl group (e.g., methyl group or ethyl group), a halogen atom, a nitro group, an amino group, or the like as a substituent.

Examples of the anion represented by $M^-$ include a hydroxide ion ($OH^-$) and the like.

Specific examples of the quaternary ammonium compound include tetramethylammonium hydroxide (TMAH), trimethyl-2-hydroxyethylammonium hydroxide (choline), tetraethylammonium hydroxide (TEAH), tetrapropylammonium hydroxide, tetrabutylammonium hydroxide, monomethyltriethylammonium hydroxide, dimethyldiethylammonium hydroxide, trimethylmonoethylammonium hydroxide, monomethyltripropylammonium hydroxide, dimethyldipropylammonium hydroxide, trimethyl monopropylammonium hydroxide, monomethyltributylammonium hydroxide, dimethyldibutylammonium hydroxide, trimethylmonobutylammonium hydroxide, monoethyltripropylammonium hydroxide, diethyldipropylammonium hydroxide, triethylmonopropylammonium hydroxide, monoethyltributylammonium hydroxide, diethyldibutylammonium hydroxide, triethyl monobutylammonium hydroxide, monopropyltributylammonium hydroxide, dipropyldibutylammonium hydroxide, tripropyl monobutylammonium hydroxide, triethyl-2-hydroxyethylammonium hydroxide, tripropyl-2-hydroxyethylammonium hydroxide, tributyl-2-hydroxyethylammonium hydroxide, trimethyl-3-hydroxypropylammonium hydroxide, triethyl-3-hydroxypropylammonium hydroxide, tripropyl-3-hydroxypropylammonium hydroxide, tributyl-3-hydroxypropylammonium hydroxide, trimethyl-4-hydroxybutylammonium hydroxide, triethyl-4-hydroxybutylammonium hydroxide, tripropyl-4-hydroxybutylammonium hydroxide, tributyl-4-hydroxybutylammonium hydroxide, trimethyl-3-hydroxybutylammonium hydroxide, triethyl-3-hydroxybutylammonium hydroxide, tripropyl-3-hydroxybutylammonium hydroxide, tributyl-3-hydroxybutylammonium hydroxide, dimethylethyl-2-hydroxyethylammonium hydroxide, methyldiethyl-2-hydroxyethylammonium hydroxide, dimethylethyl-3-hydroxypropylammonium hydroxide, methyldiethyl-3-hydroxypropylammonium hydroxide, dimethylethyl-4-hydroxybutylammonium hydroxide, methyldiethyl-4-hydroxybutylammonium hydroxide, dimethylethyl-3-hydroxybutylammonium hydroxide, methyldiethyl-3-hydroxybutylammonium hydroxide, dimethyldi(2-hydroxyethyl)ammonium hydroxide, dimethyldi(3-hydroxypropyl)ammonium hydroxide, dimethyldi(3-hydroxybutyl)ammonium hydroxide, dimethyldi(4-hydroxybutyl)ammonium hydroxide, diethyldi(2-hydroxyethyl)ammonium hydroxide, diethyldi(3-hydroxypropyl)ammonium hydroxide, diethyldi(3-hydroxybutyl)ammonium hydroxide, diethyldi(4-hydroxybutyl)ammonium hydroxide, methylethyldi(2-hydroxyethyl)ammonium hydroxide, methylethyldi(3-hydroxypropyl)ammonium hydroxide, diethyldi(3-hydroxybutyl)ammonium hydroxide, methylethyldi(4-hydroxybutyl)ammonium hydroxide, methyltri(2-hydroxyethyl)ammonium hydroxide, ethyltri(2-hydroxyethyl)ammonium hydroxide, propyltri(2-hydroxyethyl)ammonium hydroxide, butyltri(2-hydroxyethyl)ammonium hydroxide, methyltri(3-hydroxypropyl)ammonium hydroxide, ethyltri(3-hydroxybutyl)ammonium hydroxide, methyltri(4-hydroxybutyl)ammonium hydroxide, ethyltri(4-hydroxybutyl)ammonium hydroxide, methyltri(3-hydroxybutyl)ammonium hydroxide, and ethyltri(3-hydroxybutyl)ammonium hydroxide. Among these, tetramethylammonium hydroxide (TMAH) or the like is particularly preferable. These quaternary ammonium compounds may be used either individually or in combination.

The quaternary ammonium compound is preferably added in an amount of 0.1 to 5 mass %, more preferably 0.2 to 4 mass %, and particularly preferably 0.3 to 3 mass %, based on the mass of the chemical mechanical polishing aqueous dispersion during use. If the amount of the quaternary ammonium compound is less than 0.1 mass %, the polishing rate of a silicon oxide film may not be decreased (i.e., the polishing rate ratio may not be sufficiently increased). If the amount of the quaternary ammonium compound is more than 5 mass %, the surface of a silicon nitride film or a silicon oxide film may be damaged so that elevations or depressions may be formed.

1.4 pH

The pH of the chemical mechanical polishing aqueous dispersion according to this embodiment is 3 to 5. The polishing rate of a silicon nitride film can be increased if the pH of the chemical mechanical polishing aqueous dispersion is within this range. This makes it possible to sufficiently increase the polishing rate ratio of a silicon nitride film to a silicon oxide film. Moreover, the chemical mechanical polishing aqueous dispersion exhibits excellent storage stability. The pH of the chemical mechanical polishing aqueous dispersion is preferably 3 to 4.5. If the pH of the chemical mechanical polishing aqueous dispersion is less than 3, the polishing rate of a silicon nitride film may not be increased so that the object of the invention may not be achieved. If the pH of the chemical mechanical polishing aqueous dispersion is more than 5, the polishing rate of a silicon nitride film may decrease to a large extent. Moreover, the chemical mechanical polishing aqueous dispersion may exhibit poor storage stability.

1.5 Phosphoric Acid or Derivative Thereof

The chemical mechanical polishing aqueous dispersion according to this embodiment may include phosphoric acid or a derivative thereof, if necessary. The polishing rate of a silicon nitride film can be increased by adding phosphoric acid or a derivative thereof. The polishing rate of a silicon nitride film is considered to be increased due to the chemical polishing effect of phosphoric acid on a silicon nitride film and the mechanical polishing effect of the colloidal silica. This makes it possible to adjust the polishing rate of a silicon nitride film and the polishing rate of a silicon oxide film.

Phosphoric acid or a derivative thereof is preferably added in an amount of 0.1 to 3 mass %, more preferably 0.2 to 2 mass %, and particularly preferably 0.3 to 1 mass %, based on the mass of the chemical mechanical polishing aqueous dispersion during use. If the amount of phosphoric acid or a derivative thereof is more than 3 mass %, the polishing rate of a silicon oxide film may increase so that the polishing rate ratio may not be increased.

1.6 Additives

The chemical mechanical polishing aqueous dispersion according to this embodiment may include the following additives, if necessary.

1.6.1 Surfactant

The chemical mechanical polishing aqueous dispersion according to this embodiment may include a surfactant, if necessary. Examples of the surfactant include a cationic surfactant, an anionic surfactant, a nonionic surfactant, an amphoteric surfactant, and the like.

Examples of the cationic surfactant include an aliphatic amine salt, an aliphatic ammonium salt, and the like.

Examples of the anionic surfactant include a carboxylate, a sulfonate, a sulfate salt, a phosphate salt, and the like. Examples of the carboxylate include a fatty acid soap, an alkyl ether carboxylate, and the like. Examples of the sulfonate include an alkylbenzenesulfonate, an alkylnaphthalenesulfonate, an alpha-olefin sulfonate, and the like. Examples of the sulfate salt include a higher alcohol sulfate salt, an alkyl sulfate salt, and the like. Examples of the phosphate salt include an alkyl phosphate salt and the like.

Examples of the nonionic surfactant include an ether-type surfactant, an ether ester-type surfactant, an ester-type surfactant, an acetylene-type surfactant, and the like. Examples of the ether ester-type surfactant include a polyoxyethylene ether of a glycerol ester and the like. Examples of the ester-type surfactant include a polyethylene glycol fatty acid ester, glycerol ester, sorbitan ester, and the like. Examples of the acetylene-type surfactant include acetylene alcohol, acetylene glycol, an ethylene oxide adduct of acetylene diol, and the like.

Examples of the amphoteric surfactant include a betaine-type surfactant and the like.

These surfactants may be used either individually or in combination.

Among these surfactants, the anionic surfactant is preferable, with the sulfonate being particularly preferable. As the sulfonate, the alkylbenzenesulfonate is preferable, with dodecylbenzenesulfonate being particularly preferable.

The surfactant is preferably added in an amount of 1 mass % or less, and more preferably 0.001 to 0.1 mass %, based on the mass of the chemical mechanical polishing aqueous dispersion during use. If the amount of the surfactant is within this range, a smooth polished surface can be obtained after the silicon nitride film has been polished and removed.

1.6.2 Acid or Base

The chemical mechanical polishing aqueous dispersion according to this embodiment may include an acid or a base, if necessary. The pH of the chemical mechanical polishing aqueous dispersion according to this embodiment must be adjusted to 3 to 5, as described above. The acid or the base may be used to adjust the pH of the chemical mechanical polishing aqueous dispersion.

Examples of the acid include an organic acid (excluding an organic acid having two or more carboxyl groups and one or more hydroxyl groups in one molecule) and an inorganic acid.

Examples of the organic acid include p-toluenesulfonic acid, dodecylbenzenesulfonic acid, isoprenesulfonic acid, gluconic acid, lactic acid, glycolic acid, malonic acid, formic acid, oxalic acid, succinic acid, fumaric acid, maleic acid, phthalic acid, and the like.

Examples of the inorganic acid include nitric acid, sulfuric acid, and the like.

Examples of the base include an organic base and an inorganic base.

Examples of the organic base include tetramethylammonium hydroxide (TMAH), tetraethylammonium hydroxide (TEAH), and the like.

Examples of the inorganic base include an alkali metal hydroxide and the like. Specific examples of the alkali metal hydroxide include sodium hydroxide, potassium hydroxide, rubidium hydroxide, cesium hydroxide, and the like.

1.6.3 Water-Soluble Polymer

The chemical mechanical polishing aqueous dispersion according to this embodiment may include a water-soluble polymer, if necessary. The water-soluble polymer adheres to the surface of the polishing target surface and reduces friction due to polishing. Dishing and erosion can be suppressed by adding the water-soluble polymer to the chemical mechanical polishing aqueous dispersion.

Examples of the water-soluble polymer include polyacrylamide, polyacrylic acid, polyvinyl alcohol, polyvinylpyrrolidone, hydroxyethylcellulose, and the like.

The water-soluble polymer may be added in such an amount that the chemical mechanical polishing aqueous dispersion has a viscosity of less than 2 mPa·s. Since the viscosity of the chemical mechanical polishing aqueous dispersion according to this embodiment is mainly determined by the weight average molecular weight and the content of the water-soluble polymer, the viscosity of the chemical mechanical polishing aqueous dispersion may be adjusted taking account of the balance between the weight average molecular weight and the content of the water-soluble polymer. If the viscosity of the chemical mechanical polishing aqueous dispersion is more than 2 mPa·s, the polishing rate may decrease. Moreover, it may be difficult to steadily supply the chemical mechanical polishing aqueous dispersion to an abrasive cloth due to an increase in the viscosity of the chemical mechanical polishing aqueous dispersion. As result, an increase in the temperature of the abrasive cloth, polishing non-uniformity (i.e., a deterioration in in-plane uniformity), and the like may occur so that the polishing rate or dishing may vary.

1.6.4 Anti-Corrosion Agent

Examples of an anti-corrosion agent that may be used in the chemical mechanical polishing aqueous dispersion according to this embodiment include benzotriazole and a benzotriazole derivative. The term "benzotriazole derivative" used herein refers to a compound obtained by replacing at least one hydrogen atom of benzotriazole by a carboxyl group, a methyl group, an amino group, a hydroxyl group, or the like. Examples of the benzotriazole derivative include 4-carboxybenzotriazole and its salt, 7-carboxybenzotriazole and its salt, benzotriazole butyl ester, 1-hydroxymethylbenzotriazole, 1-hydroxybenzotriazole, and the like.

The anti-corrosion agent is preferably added in an amount of 1 mass % or less, and more preferably 0.001 to 0.1 mass %, based on the mass of the chemical mechanical polishing aqueous dispersion during use.

1.7 Method of Preparing Chemical Mechanical Polishing Aqueous Dispersion

The chemical mechanical polishing aqueous dispersion according to this embodiment may be prepared by dissolving or dispersing each component in a solvent such as water. The dissolution/dispersion method is not particularly limited. An arbitrary method may be used insofar as each component can be dissolved or dispersed uniformly. The order and the method of mixing each component are not particularly limited.

The chemical mechanical polishing aqueous dispersion according to this embodiment may be prepared as a concentrated solution, and may be diluted with a solvent such as water before use.

2. CHEMICAL MECHANICAL POLISHING METHOD

A chemical mechanical polishing method according to one embodiment of the invention will be described in detail below with reference to the drawings.

2.1 Polishing Target

Figure 4:
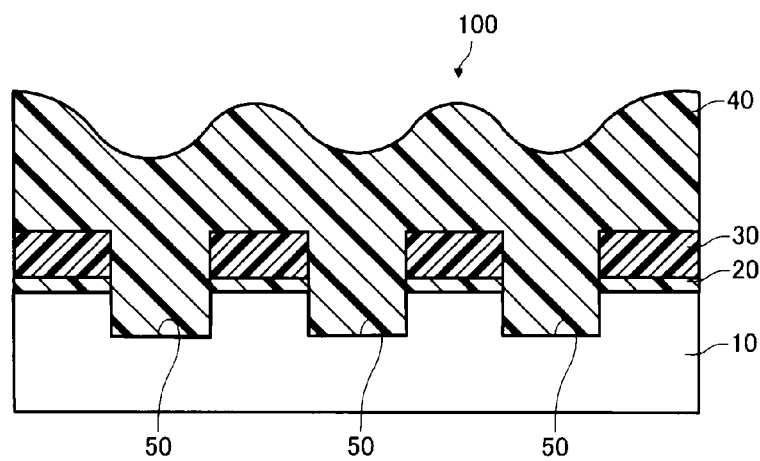
FIG. 4 is a cross-sectional view schematically illustrating a polishing target used in a chemical mechanical polishing step according to one embodiment of the invention.

FIG. 4 shows an example of a polishing target 100 of a chemical mechanical polishing method according to this embodiment. A first silicon oxide film 20 as a stopper is formed on a silicon substrate 10 using a CVD method or a thermal oxidation method. A silicon nitride film 30 is formed on the first silicon oxide film 20 using a CVD method.

The silicon nitride film 30 is then patterned. A trench 50 is formed in the silicon substrate 10, the silicon oxide film 20, and the silicon nitride film 30 by applying a photolithographic method or an etching method using the silicon nitride film 30 as a mask.

Silicon oxide is then deposited so that the trench 50 is filled therewith to obtain a polishing target 100.

2.2 Chemical Mechanical Polishing Method (1) A second silicon oxide film 40 deposited on the silicon nitride film 30 of the polishing target 100 is removed by chemical mechanical polishing using a chemical mechanical polishing aqueous dispersion that polishes the silicon oxide film at a polishing rate higher than that of the silicon nitride film. The silicon nitride film 30 serves as a stopper so that polishing can be stopped when the surface of the silicon nitride film 30 is exposed.

Figure 5:
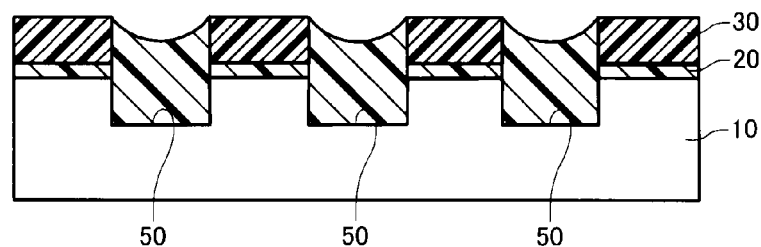
FIG. 5 is a cross-sectional view schematically illustrating a chemical mechanical polishing step according to one embodiment of the invention.

In this case, dishing occurs in the trench 50 filled with silicon oxide. The silicon nitride film 30 remains as illustrated in FIG. 5.

(2) The polishing target 100 is subjected to chemical mechanical polishing using the chemical mechanical polishing aqueous dispersion according to this embodiment in order to remove the silicon nitride film 30. Since the chemical mechanical polishing aqueous dispersion according to this embodiment has a sufficiently high polishing rate ratio of a silicon nitride film to a silicon oxide film, the silicon nitride film 30 can be selectively polished. The first silicon oxide film 20 serves as a stopper so that polishing can be stopped when the surface of the first silicon oxide film 20 is exposed.

Figure 6:
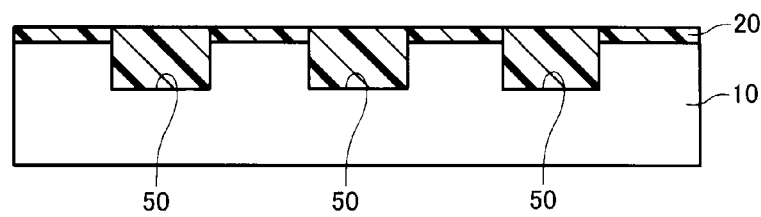
FIG. 6 is a cross-sectional view schematically illustrating a chemical mechanical polishing step according to one embodiment of the invention.

(3) A semiconductor device illustrated in FIG. 6 in which silicon oxide is embedded in the trench 50 can be produced in this manner. The chemical mechanical polishing aqueous method according to this embodiment may be applied to shallow trench isolation (STI), for example.

3. EXAMPLES

The invention is further described below by way of examples. Note that the invention is not limited to the following examples.

3.1 Preparation of Aqueous Dispersion Containing Inorganic Abrasive Grains

3.1.1 Preparation of Aqueous Dispersion Containing Colloidal Silica

A flask (2000 cm$^3$) was charged with 70 g of 25 mass % aqueous ammonia, 40 g of ion-exchanged water, 175 g of ethanol, and 21 g of tetraethoxysilane. The mixture was heated to 60° C. while stirring the mixture at 180 rpm. After stirring the mixture at 60° C. for one hour, the mixture was cooled to obtain a colloidal silica/alcohol dispersion. An operation of removing the alcohol from the dispersion at 80° C. using an evaporator while adding ion-exchanged water to the dispersion was performed several times to remove the alcohol from the dispersion. An aqueous dispersion containing 12 to 20 mass % of colloidal silica was thus prepared. The aqueous dispersion was diluted with ion-exchanged water to a concentration of 0.01 mass %. A drop of the aqueous dispersion was placed on a collodion film having a Cu grid (mesh size: 150 μm), and dried at room temperature. A sample was thus prepared on the Cu grid so that the particle shape was maintained. An image of each of fifty colloidal silica particles was photographed at a magnification of 20,000 using a transmission electron microscope ("H-7650" manufactured by Hitachi High-Technologies Corporation) to measure the major axis and the minor axis of each particle using the above-described method. The average value of the major axes and the average value of the minor axes were calculated, and the ratio of the major axis to the minor axis was then calculated. The average particle size of the colloidal silica particles calculated from the specific surface area determined by the BET method was 15 nm. The specific surface area of the colloidal silica particles was measured by the BET method after removing the particles from the aqueous dispersion and heating the particles at 800° C. Colloidal silica having a different particle size was prepared by the above-described method while appropriately adjusting the amount of tetraethoxysilane and the stirring time.

Colloidal silica manufactured by Fuso Chemical Co., Ltd. ("PL-1", "PL-1H", "PL-2L", "PL-3L", "PL-5", or "EXP-201") was also dispersed in ion-exchanged water using an ultrasonic disperser. The dispersion was filtered through a filter having a pore size of 5 μm to prepare an aqueous dispersion containing a predetermined amount of colloidal silica particles.

3.1.2 Preparation of Aqueous Dispersion Containing Fumed Silica 2 kg of "Aerosil #90" (manufactured by Nippon Aerosil Co., Ltd.) was dispersed in 6.7 kg of ion-exchanged water using an ultrasonic disperser. The dispersion was filtered through a filter having a pore size of 5 μm to prepare an aqueous dispersion containing 23 mass % of fumed silica particles. The average particle size of the fumed silica particles calculated from the specific surface area determined by the BET method was 30 nm.

3.1.3 Preparation of Aqueous Dispersion Containing Fumed Ceria

Cerium hydroxide was fired at 900° C. for two hours to obtain a cerium oxide powder. The cerium oxide powder was dispersed in ion-exchanged water using a bead mill to obtain an aqueous dispersion containing 10 mass % of cerium oxide. The average particle size of the cerium oxide particles calculated from the specific surface area determined by the BET method was 45 nm.

3.2 Preparation of Chemical Mechanical Polishing Aqueous Dispersion

A polyethylene bottle (volume: 1000 cm$^3$) was charged with a predetermined amount of the aqueous dispersion prepared as described above. After the addition of compounds shown in Tables 1, 2, or 3 in amounts shown in Tables 1, 2, or 3, the mixture was sufficiently stirred. After the addition of ion-exchanged water, the quaternary ammonium compound was gradually added to the aqueous dispersion within the range of 0.1 to 5 mass % while checking the pH of the aqueous dispersion so that the aqueous dispersion had a predetermined pH. The mixture was then filtered through a filter having a pore size of 5 μm to obtain chemical mechanical polishing aqueous dispersions of Examples 1 to 19 and Comparative Examples 1 to 12.

3.3 Chemical Mechanical Polishing Test

An 8-inch silicon substrate (polishing target) with a silicon nitride film or a silicon oxide film was chemically and mechanically polished under following "Polishing conditions 1" using the chemical mechanical polishing aqueous dispersion prepared in "3.2 Preparation of chemical mechanical polishing aqueous dispersion".
<Polishing Conditions 1>
Polishing apparatus: "EPO-112" manufactured by Ebara Corporation
Polishing pad: "IC 1000/K-Groove" manufactured by Rodel Nitta
Chemical mechanical polishing aqueous dispersion supply rate: 200 ml/min
Platen rotational speed: 90 rpm
Polishing head rotational speed: 90 rpm
Polishing head pressure: 280 hPa

3.3.1 Calculation of Polishing Rate

The thickness of the 8-inch silicon substrate (polishing target) with a silicon nitride film or a silicon oxide film before polishing was measured using an optical interference thickness meter ("NanoSpec 6100" manufactured by Nanometrics Japan Ltd.). The substrate was polished for one minute under the above-mentioned conditions. The thickness of the polishing target after polishing was measured using the optical interference thickness meter, and the difference between the thickness before polishing and the thickness after polishing (i.e., the thickness reduced by chemical mechanical polishing) was calculated. The polishing rate was calculated from the polishing time and the thickness reduced by chemical mechanical polishing. The results are shown in Tables 1 to 3.

TABLE 1

| | | Example | | | | | | | | | | |
|---|---|---|---|---|---|---|---|---|---|---|---|---|
| | | 1 | 2 | 3 | 4 | 5 | 6 | 7 | 8 | 9 | 10 | 11 |
| Colloidal silica (A) | Average particle size (nm) | 15 | 12 | 15 | 35 | 45 | 15 | 15 | 15 | 15 | 15 | 15 |
| | Major axis/minor axis | 1.66 | 1.55 | 1.66 | 1.39 | 1.8 | 1.66 | 1.66 | 1.66 | 1.66 | 1.66 | 1.66 |
| | Amount (mass %) | 3 | 2 | 1 | 1.5 | 1 | 2 | 5 | 3 | 5 | 2 | 2.5 |
| Organic acid (B) | Tartaric acid (mass %) | 1.0 | 0.5 | 3.0 | 5.0 | 4.0 | 3.0 | | | 0.1 | 0.5 | 0.5 |
| | Malic acid (mass %) | | | | | | | 3.0 | | | | |
| | Citric acid (mass %) | | | | | | | | 3.0 | | | |
| Quaternary ammonium compound (C) | Type | TMAH | TMAH | TMAH | TMAH | TMAH | TEAH | TMAH | TMAH | TMAH | TMAH | TMAH |
| Additive | Type | | | | | | | | Phosphoric acid | Phosphoric acid | Quartamin 24P | Emulgen 108 |
| | Amount (mass %) | | | | | | | | 0.5 | 0.5 | 0.5 | 0.5 |
| | Ratio (B)/(A) | 0.333 | 0.25 | 3 | 3.333 | 4 | 1.5 | 0.6 | 1 | 0.02 | 0.25 | 0.2 |
| | pH | 4.0 | 4.5 | 4.5 | 4.5 | 4.0 | 3.0 | 5.0 | 4.5 | 4.0 | 4.5 | 4.0 |
| Polishing rate (nm/min) | Silicon nitride film | 105 | 60 | 120 | 110 | 150 | 80 | 90 | 95 | 120 | 80 | 90 |
| | Silicon oxide film | 5 | 2 | 5 | 8 | 10 | 3 | 5 | 5 | 6 | 2 | 3 |
| Polishing rate ratio | | 21 | 30 | 24 | 13.8 | 15 | 26.7 | 18 | 19 | 20 | 40 | 30 |

TMAH: tetramethylammonium hydroxide
TEAH: tetraethylammonium hydroxide
Quartamin 24P: dodecyltrimethylammonium chloride
Emulgen 108: polyoxyethylene lauryl ether

TABLE 2

| | | Example | | | | | | | |
|---|---|---|---|---|---|---|---|---|---|
| | | 12 | 13 | 14 | 15 | 16 | 17 | 18 | 19 |
| Colloidal silica (A) | Trade name | PL-1H | PL-1 | PL-1 | PL-5 | PL-2L | EXP-201 | EXP-201 | EXP-201 |
| | Average particle size (nm) | 13 | 15 | 15 | 52 | 17 | 52 | 52 | 52 |
| | Major axis/minor axis | 1.5 | 1.7 | 1.7 | 1.0 | 1.2 | 1.3 | 1.3 | 1.3 |
| | Amount (mass %) | 2.4 | 2.4 | 2.4 | 2.4 | 2.4 | 2.4 | 2.0 | 2.0 |

TABLE 2-continued

|  |  | Example | | | | | | | |
|---|---|---|---|---|---|---|---|---|---|
|  |  | 12 | 13 | 14 | 15 | 16 | 17 | 18 | 19 |
| Organic acid (B) | Tartaric acid (mass %) | 0.5 | 0.5 | 1.0 | 0.5 | 0.5 | 0.5 | 0.5 | 0.6 |
|  | Malic acid (mass %) |  |  |  |  |  |  |  |  |
|  | Citric acid (mass %) |  |  |  |  |  |  |  |  |
| Quaternary ammonium compound (C) | Type | TMAH | TMAH | TMAH | TMAH | TMAH | TMAH | TMAH | TMAH |
| Additive | Type | Phosphoric acid | Phosphoric acid |  | Phosphoric acid | Phosphoric acid | Phosphoric acid | Phosphoric acid |  |
|  | Amount (mass %) | 0.6 | 0.6 |  | 0.6 | 0.6 | 0.6 | 0.6 |  |
|  | Ratio (B)/(A) | 0.21 | 0.21 | 0.42 | 0.21 | 0.21 | 0.21 | 0.25 | 0.30 |
|  | pH | 4.0 | 4.0 | 4.0 | 4.0 | 4.0 | 4.0 | 4.0 | 4.0 |
| Polishing rate (nm/min) | Silicon nitride film | 87 | 92 | 95 | 45 | 57 | 80 | 65 | 60 |
|  | Silicon oxide film | 3.6 | 5 | 3 | 55 | 45 | 85 | 60 | 55 |
|  | Polishing rate ratio | 24 | 18 | 32 | 0.8 | 1.3 | 0.9 | 1.1 | 1.1 |

TMAH: tetramethylammonium hydroxide

TABLE 3

|  |  | Comparative Example | | | | | |
|---|---|---|---|---|---|---|---|
|  |  | 1 | 2 | 3 | 4 | 5 | 6 |
| Colloidal silica (A) | Trade name |  |  |  |  | PL-1 | PL-1 |
|  | Average particle size (nm) |  |  |  |  | 15 | 15 |
|  | Major axis/minor axis |  |  |  |  | 1.7 | 1.7 |
|  | Amount (mass %) |  |  |  |  | 2.0 | 2.0 |
| Fumed silica | Average particle size (nm) |  | 30 | 30 |  |  |  |
|  | Amount (mass %) |  | 2.0 | 5.0 |  |  |  |
| Fumed ceria | Average particle size (nm) |  |  |  | 45 |  |  |
|  | Amount (mass %) |  |  |  | 2.0 |  |  |
| Organic acid (B) | Tartaric acid (mass %) | 0.6 |  | 0.5 |  |  |  |
|  | Malic acid (mass %) |  |  |  | 3.0 |  |  |
|  | Citric acid (mass %) |  |  |  |  |  |  |
| Quaternary ammonium compound (C) | Type | TMAH |  | TMAH | TMAH | TMAH | TMAH |
| Additive | Type |  | KOH |  |  |  |  |
|  | Amount (mass %) |  | pH adjustment amount |  |  |  |  |
|  | Type |  | Succinic acid |  |  | Acetic acid | Succinic acid |
|  | Amount (mass %) |  | 1.0 |  |  | 0.5 | 0.5 |
|  | Ratio (B)/(A) | — | — | 0.1 | 1.5 | — | — |
|  | pH | 2.1 | 3.5 | 4.0 | 5.0 | 4.0 | 4.0 |
| Polishing rate | Silicon nitride film | 3 | 5 | 60 | 10 | 5 | 10 |
|  | Silicon oxide film | 2 | 10 | 30 | 50 | 5 | 5 |
|  | Polishing rate ratio | 1.5 | 0.5 | 2.0 | 0.2 | 1.0 | 2.0 |

|  |  | Comparative Example | | | | | |
|---|---|---|---|---|---|---|---|
|  |  | 7 | 8 | 9 | 10 | 11 | 12 |
| Colloidal silica (A) | Trade name | PL-1 |  |  |  | PL-3L | PL-5 |
|  | Average particle size (nm) | 15 | 6 | 60 | 80 | 35 | 52 |
|  | Major axis/minor axis | 1.7 | 3.0 | — | 3.0 | 1.0 | 1.0 |
|  | Amount (mass %) | 2.0 | 2.0 | 3.0 | 2.0 | 2.5 | 5.0 |
| Fumed silica | Average particle size (nm) |  |  |  |  |  |  |
|  | Amount (mass %) |  |  |  |  |  |  |
| Fumed ceria | Average particle size (nm) |  |  |  |  |  |  |
|  | Amount (mass %) |  |  |  |  |  |  |

TABLE 3-continued

| | | | | | | | |
|---|---|---|---|---|---|---|---|
| Organic acid (B) | Tartaric acid (mass %) | | 1.0 | | 1.0 | 0.6 | 1.0 |
| | Malic acid (mass %) | | | | | | |
| | Citric acid (mass %) | | | 0.5 | | | |
| Quaternary ammonium compound (C) | Type | TMAH | TMAH | | | TMAH | TMAH |
| Additive | Type | | | | | KOH | |
| | Amount (mass %) | | | | | 0.5 | |
| | Type | Methanol | | | | | |
| | Amount (mass %) | 0.5 | | | | | |
| | Ratio (B)/(A) | — | 0.5 | 0.167 | 0.5 | 0.01 | 0.01 |
| | pH | 4.0 | 4.0 | 4.0 | 4.0 | 5.5 | 2.3 |
| Polishing rate | Silicon nitride film | 10 | 30 | 50 | Could not be evaluated | 40 | 53 |
| | Silicon oxide film | 20 | 20 | 80 | | 85 | 100 |
| | Polishing rate ratio | 0.5 | 1.5 | 0.6 | — | 0.5 | 0.5 |

TMAH: tetramethylammonium hydroxide

3.4 Examples 1 to 19 and Comparative Examples 1 to 12

In Examples 1 to 19 and Comparative Examples 1 to 12, the component or the concentration of the chemical mechanical polishing aqueous dispersion was changed as shown in Tables 1 to 3. The test results are also shown in Tables 1 to 3.

The chemical mechanical polishing aqueous dispersions of Examples 1 to 14 contained the colloidal silica particles of which the ratio of the major axis to the minor axis was greater than 1.3. The polishing rate ratio of the silicon nitride film to the silicon oxide film achieved by the chemical mechanical polishing aqueous dispersions of Examples 1 to 14 was sufficiently greater than 10. Therefore, the silicon nitride film can be selectively polished by chemical mechanical polishing using each of the chemical mechanical polishing aqueous dispersions of Examples 1 to 14.

The chemical mechanical polishing aqueous dispersions of Examples 15 to 19 contained the colloidal silica particles of which the ratio of the major axis to the minor axis was 1.0 to 1.3. The polishing rate ratio of the silicon nitride film to the silicon oxide film achieved by the chemical mechanical polishing aqueous dispersions of Examples 15 to 19 was 0.9 to 1.2. Therefore, the silicon nitride film and the silicon oxide film can be simultaneously polished by chemical mechanical polishing using each of the chemical mechanical polishing aqueous dispersions of Examples 15 to 19.

In Comparative Example 1, tartaric acid and tetramethylammonium hydroxide (TMAH) were used without using the abrasive grains. The polishing rate was insufficient due to the absence of the abrasive grains.

In Comparative Example 2, fumed silica (abrasive grains), succinic acid having two carboxyl groups and an ethyl group, and potassium hydroxide (pH adjusting agent) were used. The polishing rate achieved by Comparative Example 2 was insufficient.

In Comparative Example 3, fumed silica was used as the abrasive grains. A sufficiently high polishing rate ratio could not be obtained by the chemical mechanical polishing aqueous dispersion of Comparative Example 3.

In Comparative Example 4, fumed ceria was used as the abrasive grains. As a result, the polishing rate of the silicon oxide film increased.

In Comparative Examples 5, 6, and 7, colloidal silica and acetic acid, succinic acid, or methanol were used without using the specific organic acid. In each case, the polishing rate of the silicon oxide film and the polishing rate of the silicon nitride film were insufficient.

In Comparative Example 8, colloidal silica having an average particle size of 6 nm was used. As a result, the polishing rate was insufficient.

In Comparative Example 9, the quaternary ammonium compound was not used. As a result, the polishing rate of the silicon oxide film increased.

In Comparative Example 10, colloidal silica having an average particle size of 80 nm was used. As a result, a large number of scratches occurred (the polishing rate could not be evaluated).

In Comparative Example 11, the pH of the chemical mechanical polishing aqueous dispersion was adjusted to 5.5. As a result, the polishing rate of the silicon oxide film increased.

In Comparative Example 12, the pH of the chemical mechanical polishing aqueous dispersion was adjusted to 2.3. As a result, the polishing rate of the silicon oxide film increased.

As described above, the object of the invention could not be achieved when using the chemical mechanical polishing aqueous dispersions of Comparative Examples 1 to 12.

3.5 Experimental Examples

3.5.1 First Experimental Example

Figure 7:
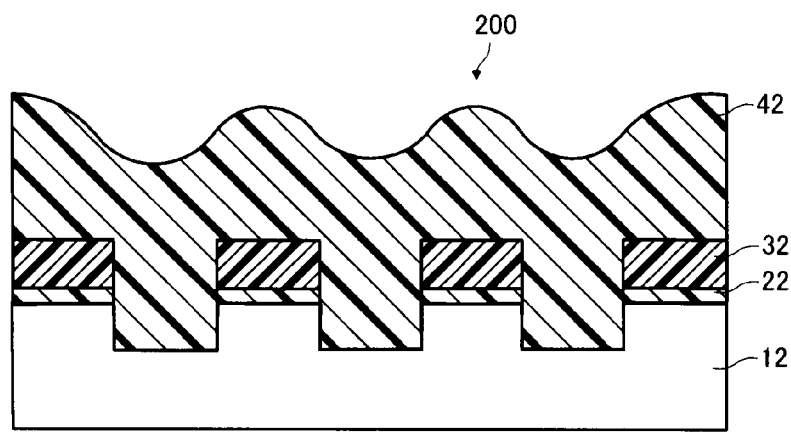
FIG. 7 is a cross-sectional view schematically illustrating a polishing target used for a chemical mechanical polishing aqueous dispersion according to a first experimental example.

A test wafer in which a silicon nitride film was embedded was chemically and mechanically polished. Specifically, a test wafer "864CMP" (manufactured by Advanced Materials Technology Inc., the test wafer had a cross-sectional structure illustrated in FIG. 7, in which the thickness from the bottom of a polysilicon film 12 to the top of a silicon nitride film 32 was about 500 nm, the thickness of a first silicon oxide film 22 was about 10 nm, and the thickness of the silicon nitride film 32 was about 150 nm) was used as a polishing target 200.

The test wafer was preliminarily chemically and mechanically polished for 150 seconds under following "Polishing conditions 2" using "CMS4301" and CMS4302 (manufactured by JSR Corporation).

Figure 8:
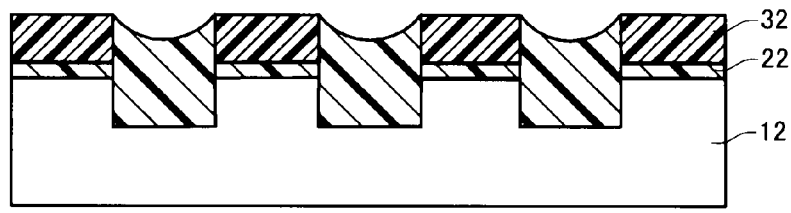
FIG. 8 is a cross-sectional view schematically illustrating a chemical mechanical polishing step according to a first experimental example.

<Polishing Conditions 2>
Polishing apparatus: "EPO-112" manufactured by Ebara Corporation
Polishing pad: "IC 1000/K-Groove" manufactured by Rodel Nitta
Chemical mechanical polishing aqueous dispersion supply rate: 200 ml/min
Platen rotational speed: 100 rpm
Polishing head rotational speed: 107 rpm Polishing head pressure: 350 hPa A second silicon oxide film 42 formed on the silicon nitride film 32 was completely removed by chemical mechanical polishing, as illustrated in FIG. 8. The thickness of the silicon nitride film 32 within the 100 μm pattern pitch (pattern density: 50%) measured using the optical interference thickness meter "NanoSpec 6100" was about 140 nm.

The depth of dishing of the silicon oxide film 42 with respect to the silicon nitride film 32 measured using a contact-type profilometer "HRP240" was about 140 nm.

The test wafer was then polished for 150 seconds under the above "Polishing conditions 1" using the chemical mechanical polishing aqueous dispersion of Example 1.

Figure 9:
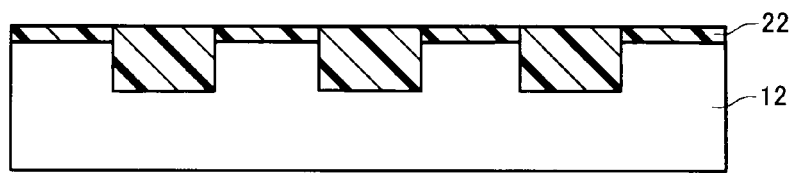
FIG. 9 is a cross-sectional view schematically illustrating a chemical mechanical polishing step according to a first experimental example.

The thickness of the silicon nitride film 32 after chemical mechanical polishing within the polishing target surface was about 0 nm, as illustrated in FIG. 9. The depth of dishing within the 100 μm pattern pitch (pattern density: 50%) was also about 0 nm.

As is clear from the above results, since the chemical mechanical polishing aqueous dispersion of Example 1 had a sufficiently high polishing rate ratio of the silicon nitride film to the silicon oxide film, the silicon nitride film could be selectively polished.

3.5.2 Second Experimental Example

Figure 10:
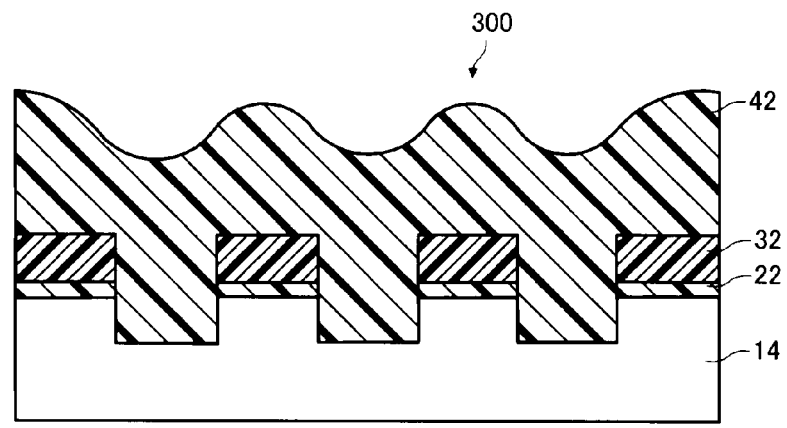
FIG. 10 is a cross-sectional view schematically illustrating a polishing target used for a chemical mechanical polishing aqueous dispersion according to a second experimental example.

A test wafer in which a silicon nitride film was embedded was chemically and mechanically polished. Specifically, a test wafer "864CMP" (manufactured by Advanced Materials Technology Inc., the test wafer had a cross-sectional structure illustrated in FIG. 10, in which the thickness from the bottom of a silicon film 14 to the top of a silicon nitride film 32 was about 500 nm, the thickness of a silicon oxide film 22 was about 10 nm, and the thickness of the silicon nitride film 32 was about 150 nm) was used as a polishing target 300.

The test wafer was preliminarily chemically and mechanically polished for 100 seconds under the above "Polishing conditions 2" using CMS4301 and CMS4302 (manufactured by JSR Corporation).

Figure 11:
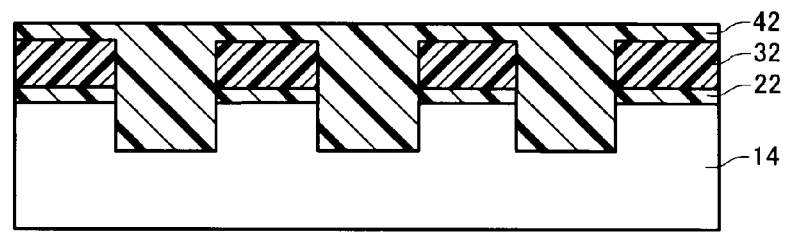
FIG. 11 is a cross-sectional view schematically illustrating a chemical mechanical polishing step according to a second experimental example.

A silicon oxide film 42 formed on the silicon nitride film 32 was almost completely removed by chemical mechanical polishing, as illustrated in FIG. 11. The thickness of the silicon oxide film 42 formed on the silicon nitride film 32 within the 100 μm pattern pitch (pattern density: 50%) measured using the optical interference thickness meter "NanoSpec 6100" was about 100 nm.

The step height of the silicon nitride film 32 was measured using a contact-type profilometer "HRP240". No step height of the silicon nitride film 32 was observed.

The test wafer was then polished for 180 seconds under the above "Polishing conditions 1" using the chemical mechanical polishing aqueous dispersion of Example 15.

Figure 12:
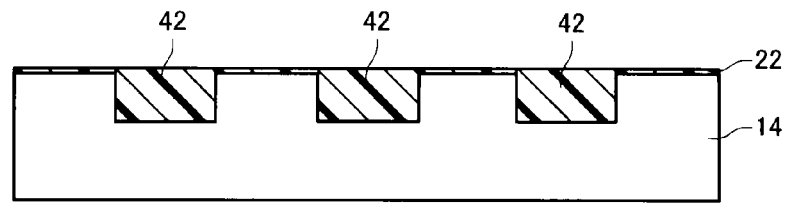
FIG. 12 is a cross-sectional view schematically illustrating a chemical mechanical polishing step according to a second experimental example.

A semiconductor device illustrated in FIG. 12 was thus obtained. The thickness of the silicon nitride film 32 after polishing within the polishing target surface was about 0 nm. The depth of dishing of the second silicon oxide film 42 within the 100 μm pattern pitch (pattern density: 50%) was also about 0 nm.

As is clear from the above results, since the polishing rate of the silicon nitride film can be made almost equal to the polishing rate of the silicon oxide film when using the chemical mechanical polishing aqueous dispersion of Example 15, dishing of the silicon oxide film can be suppressed. This is effective when removing the silicon nitride film.

3.5.3 Third Experimental Example

A polishing target 300 (see FIG. 10) was chemically and mechanically polished in the same manner as in the first experimental example.

Figure 13:
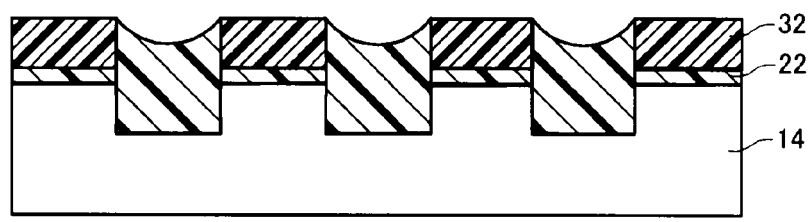
FIG. 13 is a cross-sectional view schematically illustrating a chemical mechanical polishing step according to a third experimental example.

The second silicon oxide film 42 formed on the silicon nitride film 32 was completely removed by chemical mechanical polishing, as illustrated in FIG. 13. The thickness of the silicon nitride film 32 within the 100 μm pattern pitch (pattern density: 50%) measured using the optical interference thickness meter "NanoSpec 6100" was about 140 nm.

The depth of dishing of the silicon oxide film 42 with respect to the silicon nitride film 32 measured using a contact-type profilometer "HRP240" was about 140 nm.

The polishing target was then polished for 150 seconds under the above "Polishing conditions 1" using the chemical mechanical polishing aqueous dispersion of Example 1.

Figure 14:
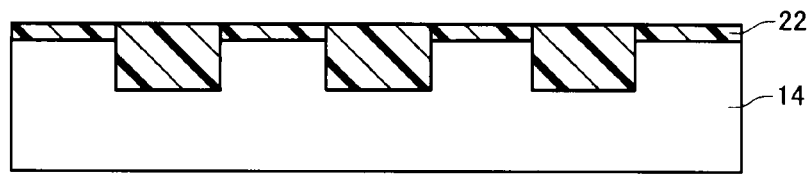
FIG. 14 is a cross-sectional view schematically illustrating a chemical mechanical polishing step according to a third experimental example.

The thickness of the silicon nitride film 32 after chemical mechanical polishing within the polishing target surface was about 0 nm, as illustrated in FIG. 14. The depth of dishing within the 100 μm pattern pitch (pattern density: 50%) was also about 0 nm.

As is clear from the above results, since the chemical mechanical polishing aqueous dispersion of Example 1 had a sufficiently high polishing rate ratio of the silicon nitride film to the silicon oxide film, the silicon nitride film could be selectively polished.

The invention claimed is:

1. A chemical mechanical polishing aqueous dispersion comprising:
   (A) colloidal silica having an average particle size calculated from the specific surface area determined by the BET method of 10 to 60 nm;
   (B) an organic acid having two or more carboxyl groups and one or more hydroxyl groups in one molecule; and
   (C) a quaternary ammonium compound represented by formula (I),

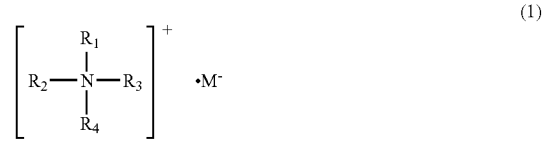

(1)

wherein $R_1$ to $R_4$ individually represent hydrocarbon groups, and $M^-$ represents an anion, the chemical mechanical polishing aqueous dispersion having a pH of 3 to 5, and wherein the ratio of the major axis (Rmax) to the minor axis (Rmin) of the colloidal silica particles (A) is greater than 1.3.

2. The chemical mechanical polishing aqueous dispersion according to claim 1, wherein (B) is at least one organic acid selected from tartaric acid, malic acid, and citric acid.

3. The chemical mechanical polishing aqueous dispersion according to claim 1, further comprising phosphoric acid or a derivative of phosphoric acid.

4. The chemical mechanical polishing aqueous dispersion according to claim 1, wherein the mass ratio of the component (B) to the component (A) is 0.02 to 10.

5. The chemical mechanical polishing aqueous dispersion according to claim 1, wherein the chemical mechanical polishing aqueous dispersion has a polishing rate ratio of a silicon nitride film to a silicon oxide film of greater than 10.

6. A chemical mechanical polishing method for a semiconductor device that includes a silicon oxide film and a silicon nitride film formed on the silicon oxide film, said method comprising:
selectively polishing the silicon nitride film by using the chemical mechanical polishing aqueous dispersion according to claim 1; and
stopping the polishing when the surface of the silicon oxide film is exposed.

7. A chemical mechanical polishing aqueous dispersion comprising:
(A) colloidal silica having an average particle size calculated from the specific surface area determined by the BET method of 10 to 60 nm;
(B) an organic acid having two or more carboxyl groups and one or more hydroxyl groups in one molecule;
(C) a quaternary ammonium compound represented by formula (I),

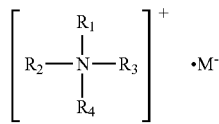
(1)

wherein $R_1$ to $R_4$ individually represent hydrocarbon groups, and $M^-$ represents an anion, the chemical mechanical polishing aqueous dispersion having a pH of 3 to 5, and wherein the ratio of the major axis (Rmax) to the minor axis (Rmin) of the colloidal silica particles (A) is 1.0 to 1.3.

8. The chemical mechanical polishing aqueous dispersion according to claim 7, wherein (B) is at least one organic acid selected from tartaric acid, malic acid, and citric acid.

9. The chemical mechanical polishing aqueous dispersion according to claim 7, further comprising phosphoric acid or a derivative of phosphoric acid.

10. The chemical mechanical polishing aqueous dispersion according to claim 7, wherein the mass ratio of (B) to (A) is 0.02 to 10.

11. The chemical mechanical polishing aqueous dispersion according to claim 7, wherein the chemical mechanical polishing aqueous dispersion has a polishing rate ratio of a silicon nitride film to a silicon oxide film of 0.7 to 1.4.

12. A chemical mechanical polishing method for a semiconductor device that includes a silicon oxide film and a silicon nitride film on the surface of the semiconductor device, comprising:
simultaneously polishing the silicon oxide film and the silicon nitride film by using the chemical mechanical polishing aqueous dispersion according to claim 7.

* * * * *